(12) United States Patent
Ishikawa et al.

(10) Patent No.: US 8,860,170 B2
(45) Date of Patent: Oct. 14, 2014

(54) POWER SEMICONDUCTOR WITH A SI CHIP AND A WIDEBAND CHIP HAVING MATCHED LOSS AND AREA RATIOS

(71) Applicant: Hitachi, Ltd., Tokyo (JP)

(72) Inventors: Katsumi Ishikawa, Hitachinaka (JP); Kazutoshi Ogawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/845,627

(22) Filed: Mar. 18, 2013

(65) Prior Publication Data
US 2013/0214328 A1 Aug. 22, 2013

Related U.S. Application Data

(63) Continuation of application No. 12/707,909, filed on Feb. 18, 2010, now Pat. No. 8,441,075.

(30) Foreign Application Priority Data

Mar. 30, 2009 (JP) .................. 2009-080850

(51) Int. Cl.
*H01L 27/06* (2006.01)
*H01L 25/18* (2006.01)
*H01L 25/07* (2006.01)

(52) U.S. Cl.
CPC ............ *H01L 27/06* (2013.01); *H01L 25/072* (2013.01); *H01L 2224/49111* (2013.01); *H01L 2224/48227* (2013.01); *H01L 2924/13091* (2013.01); *H01L 2924/13055* (2013.01); *H01L 25/18* (2013.01)
USPC ...................... 257/477; 257/E27.04; 257/474

(58) Field of Classification Search
CPC ........... H01L 2924/13091; H01L 2924/13055; H01L 27/06; H01L 25/072; H01L 25/18; H01L 2224/48227; H01L 2224/49111
USPC .......................... 257/197, 370, 378, 474, 477
See application file for complete search history.

(56) References Cited

U.S. PATENT DOCUMENTS

| | | | |
|---|---|---|---|
| 6,429,507 B1 | 8/2002 | Knudtsen et al. | |
| 2004/0007772 A1 | 1/2004 | Arai et al. | |
| 2007/0057284 A1 | 3/2007 | Casey et al. | |
| 2007/0166877 A1 | 7/2007 | Otremba | |
| 2008/0258252 A1* | 10/2008 | Shimizu et al. | 257/476 |
| 2009/0058350 A1* | 3/2009 | Wei et al. | 318/722 |
| 2009/0127685 A1 | 5/2009 | Jong et al. | |
| 2009/0225578 A1* | 9/2009 | Kitabatake | 363/132 |
| 2009/0316457 A1 | 12/2009 | Friebe et al. | |

FOREIGN PATENT DOCUMENTS

JP 2004-047883 2/2004

* cited by examiner

*Primary Examiner* — Fernando L Toledo
*Assistant Examiner* — Peter Bradford
(74) *Attorney, Agent, or Firm* — Antonelli, Terry, Stout & Kraus, LLP.

(57) ABSTRACT

A power semiconductor apparatus which is provided with a first power semiconductor device using Si as a base substance and a second power semiconductor device using a semiconductor having an energy bandgap wider than the energy bandgap of Si as a base substance, and includes a first insulated metal substrate on which the first power semiconductor device is mounted, a first heat dissipation metal base on which the first insulated metal substrate is mounted, a second insulated metal substrate on which the second power semiconductor device is mounted, and a second heat dissipation metal base on which the second insulated metal substrate is mounted.

1 Claim, 8 Drawing Sheets

POWER SEMICONDUCTOR WITH A SI CHIP AND A WIDEBAND CHIP HAVING MATCHED LOSS AND AREA RATIOS

CROSS REFERENCE TO RELATED APPLICATIONS

This application is a continuation application of U.S. application Ser. No. 12/707,909 filed Feb. 18, 2010, now U.S. Pat. No. 8,441,075 issued May 14, 2013, which claims the foreign priority benefit under Title 35, United States Code, §119(a)-(d) of Japanese Patent Application No. 2009-080850, filed on Mar. 30, 2009, the contents of which are hereby incorporated by reference.

FIELD OF THE INVENTION

The present invention relates to a power semiconductor apparatus which is provided with a power semiconductor device using Si as a base substance and a power semiconductor device using a wide-gap semiconductor as a base substance.

DESCRIPTION OF RELEVANT ART

A wide-gap semiconductor device using silicon carbide (SiC) or gallium nitride (GaN) which has a wider energy bandgap than that of silicon (Si) is getting a lot of attention. Since these materials have a breakdown field ten times higher than that of Si and thereby a drift layer for securing a breakdown voltage can be made thin about 1/10 in comparison with Si, a lowering of ON-voltage of a power semiconductor device and operation thereof at high temperature can be achieved.

In such a power semiconductor apparatus as a semiconductor module which is used as an inverter in the fields of railway, industries, automobile, home appliances or power sources, a switching device such as IGBT and a recirculation diode are connected in anti-parallel. When a power semiconductor device using Si as a base substance and a power semiconductor device using SiC or GaN as the base substance are mounted on the power semiconductor apparatus, a junction temperature (Tj) of the power semiconductor device using Si is limited to not more than 175° C. On the other hand, the power semiconductor device using SiC or GaN as the base substance can operate even if the junction temperature (Tj)) is not less than 200° C. Therefore, as described in JP2004-47883, a power semiconductor apparatus which sandwiches a heat insulator between a power semiconductor device using Si as the base substance and a power semiconductor device using SiC or GaN as the base substance has been proposed.

In addition, a leakage current of the power semiconductor device using SiC or GaN as the base substance is large due to the effect of crystal defects. Especially, a leakage current of a Schottky-barrier diode using SiC or GaN becomes large.

In the power semiconductor apparatus described in JP2004-47883, the power semiconductor device using Si as the base substance and the power semiconductor device using SiC or GaN as the base substance are both mounted on a collector electrode. In this case, a heat generated in the power semiconductor device using SiC or GaN as the base substance is likely to be transferred to a mounting portion of the power semiconductor device using Si as the base substance via the collector electrode.

In addition, a voltage terminal on the side of the positive electrode (collector) and a voltage terminal on the side of the negative electrode (emitter) of the module, on which the power semiconductor device using Si as the base substance and the power semiconductor device using SiC or GaN as the base substance are mounted, are commonly-formed for the devices, and when a leakage current between the terminals of the positive terminal and the negative terminal is measured, a leakage current of the power semiconductor device using SiC or GaN as the base substance becomes larger than that of the power semiconductor device using Si as the base substance. Therefore, it is difficult to accurately measure leakage current characteristics of the power semiconductor device using Si as the base substance.

The present invention has been developed in consideration of the foregoing problems, and it is an object of the present invention to provide a power semiconductor apparatus which is thermally and electrically highly reliable even if a power semiconductor device using Si as the base substance and a power semiconductor device using SiC or GaN as the base substance are mounted in mixture (mixedly) on the power semiconductor apparatus.

SUMMARY OF THE INVENTION

According to a first aspect of the present invention, there is provided a power semiconductor apparatus which is provided with a first insulated metal substrate on which a first power semiconductor device using Si as a base substance is mounted, a first heat dissipation metal base on which the first insulated metal substrate is mounted, a second insulated metal substrate on which a second power semiconductor device using a semiconductor having an energy bandgap wider than the energy bandgap of Si as a base substance is mounted, and a second heat dissipation metal base on which the second insulated metal substrate is mounted.

In addition, according to a second aspect of the present invention, there is provided a power semiconductor apparatus, where a positive and a negative main terminals to which the first power semiconductor device using Si as the base substance are connected, and a positive and a negative main terminals of the second power semiconductor device using a semiconductor having an energy bandgap wider than the energy bandgap of Si as a base substance are connected are electrically separated.

Here, it is preferable that the first power semiconductor device is a switching device such as an IGBT and the second power semiconductor device is a diode such as a Schottky-barrier diode. In addition, as a semiconductor having an energy bandgap wider than the energy bandgap of Si, SiC, GaN and diamond may be used.

Since a power semiconductor device using Si as a base substance and a power semiconductor device using a semiconductor having an energy bandgap wider than the energy bandgap of Si are mounted on respective insulated metal substrates, and in addition, since the insulated metal substrates are mounted on respective heat dissipation metal bases, a heat conduction between both the power semiconductor devices can be suppressed. Furthermore, since the positive and the negative main terminals of the power semiconductor device using Si are electrically separated from those of the power semiconductor device using a semiconductor having an energy bandgap wider than the energy bandgap of Si, leakage currents of both power semiconductor devices can be accurately measured.

DETAILED DESCRIPTION OF THE PREFERRED EMBODIMENT

Embodiments of the present invention will be described in detail by referring to drawings.

Figure 1:
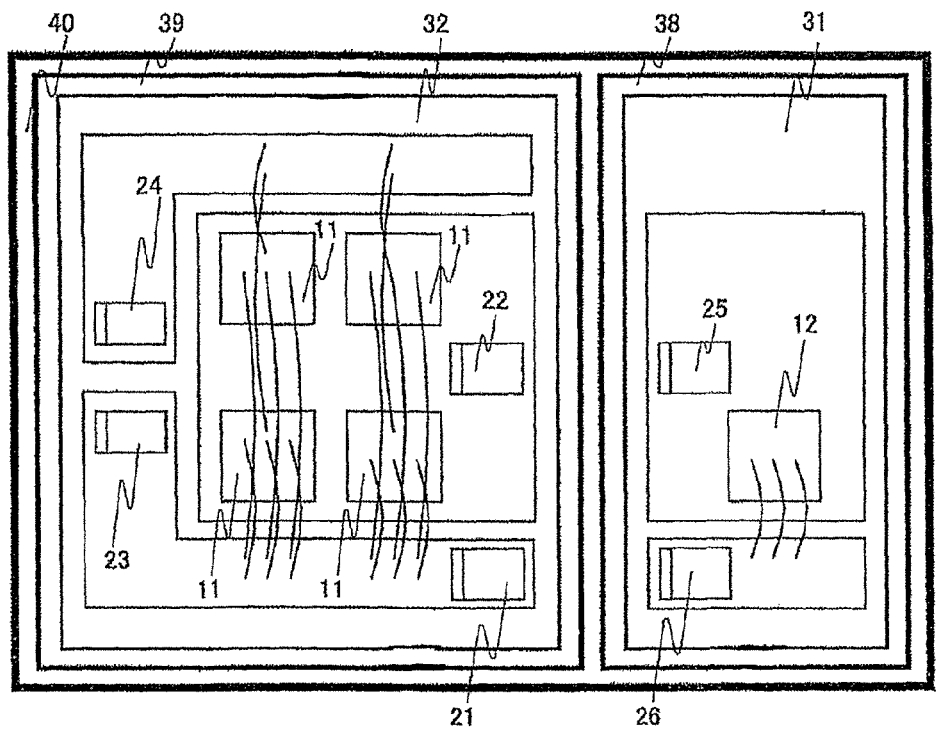
FIG. 1 is a mounting arrangement of a power semiconductor apparatus according to a first embodiment of the present invention.

FIG. 1 shows a mounting arrangement of a power semiconductor apparatus according to a first embodiment of the present invention. In the embodiment, IGBT 11 which is a switching device using Si as a base substance (hereinafter, referred to as Si-IGBT) is bonded to and mounted on an insulated metal substrate 32 by, for example, solder and a Schottky-barrier diode (hereinafter, referred to as SiC-SBD) 12 which is a diode using SiC as a base substance is bonded to and mounted on another insulated metal substrate 31 by, for example, solder. In addition, the insulated metal substrate 32 on which the Si-IGBT 11 is mounted is bonded to a heat dissipation metal base 39 by solder and the insulated metal substrate 31 on which the SIC-SED 12 is mounted is bonded to a heat dissipation metal base 38 by solder, and both the insulated metal substrates 31, 32 are integrated by a resin case 40 as a module. Here, the heat dissipation metal base 38 on which the insulated metal substrate 31 is mounted and the heat dissipation metal base 39 on which the insulated metal substrate 32 is mounted are arranged on substantially the same plane in the module, and apart of the resin case 40 lies between the heat dissipation metal bases 38, 39. In addition, when a power semiconductor apparatus according to the embodiment is applied to, for example, an inverter, the heat dissipation metal bases 38, 39 are in contact with a surface of heat dissipation fin at back sides of mounting surfaces of the insulated metal substrates 31, 32. A collector terminal 22, an emitter terminal 21, an emitter control terminal 23 and a gate control terminal 24 are connected to the insulated metal substrate 32 by, for example, solder bonding. In addition, a cathode terminal 25 and an anode terminal 26 are connected to the insulated metal substrate 31 by, for example, solder bonding.

Figure 3:
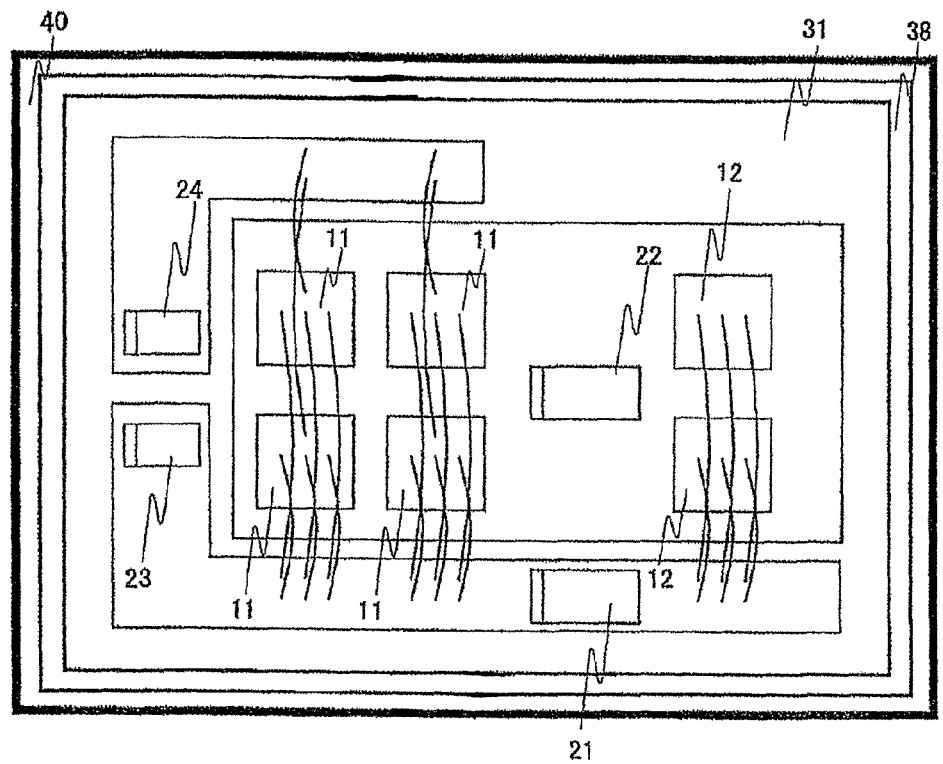
FIG. 3 is a mounting arrangement example of a conventional power semiconductor apparatus.

FIG. 3 shows a mounting arrangement example of a conventional power semiconductor apparatus. In a mounting method of the conventional power semiconductor apparatus, the Si-IGBT 11 and the SiC-SBD 12 are mounted on the same insulated metal substrate 31. In this case, due to a heat generation of the Si-IGBT 11 and the SiC-SBD 12, a heat is likely to be transferred to each of the chips via the insulated metal substrate 31. Therefore, although a SiC-SBD generally can operate at a higher temperature in comparison with a Si-IGBT, an operation temperature of the SiC-SBD 12 is limited to that of the Si-IGBT 11. On the other hand, in the first embodiment, since the heat dissipation metal base 39 including the insulated metal substrate 32 on which the Si-IGBT 11 is mounted is separated from the heat dissipation metal base 38 including the insulated metal substrate 31 on which the SiC-SBD 12 is mounted, the SiC-SBD 12 can be operated at a high temperature without limitation of the operation temperature of the Si-IGBT 11.

Figure 2:
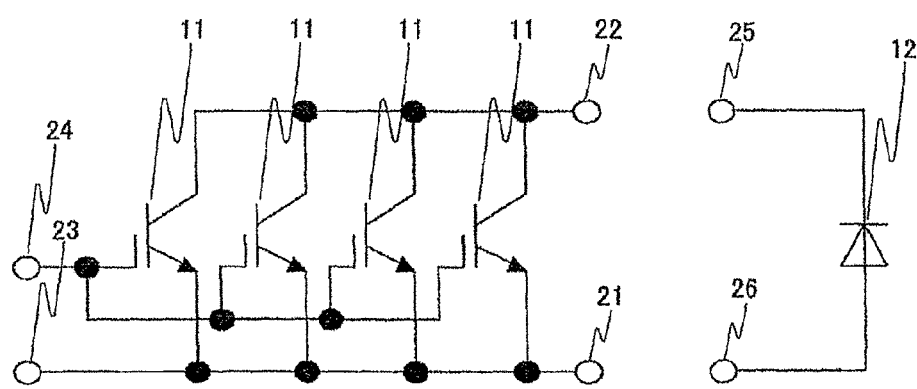
FIG. 2 is a circuit diagram of a power semiconductor apparatus according to the first embodiment.

FIG. 2 shows a circuit diagram of a power semiconductor apparatus according to the first embodiment. The collector terminal 22 and the emitter terminal 21 which are connected to the Si-IGBT 11 are separated from the cathode terminal 25 and the anode terminal 26 which are connected to the SiC-SBD 12. That is, in a power semiconductor apparatus which has no external wiring connection, a positive and a negative main terminals of the Si-IGBT 11 are not connected to a positive and a negative main terminals of the SiC-SBD 12 by internal wiring, and the positive and the negative main terminals of the Si-IGBT 11 are electrically separated from the positive and the negative main terminals of the SiC-SBD 12.

Figure 4:
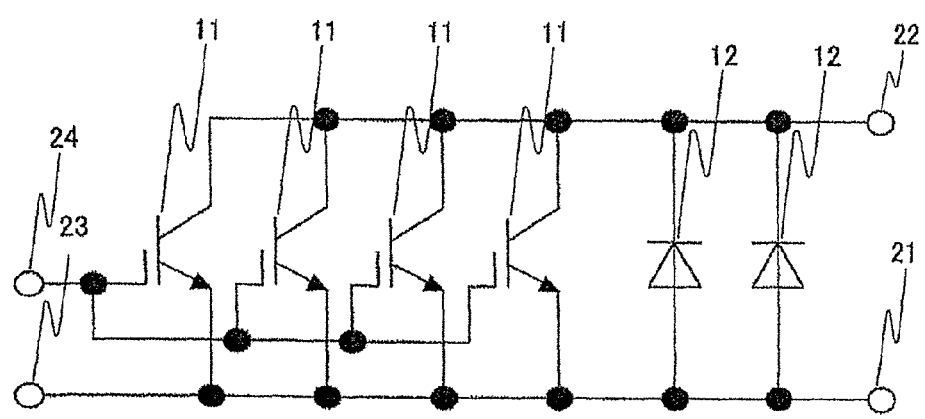
FIG. 4 is a circuit diagram of a conventional power semiconductor apparatus.
Figure 5:
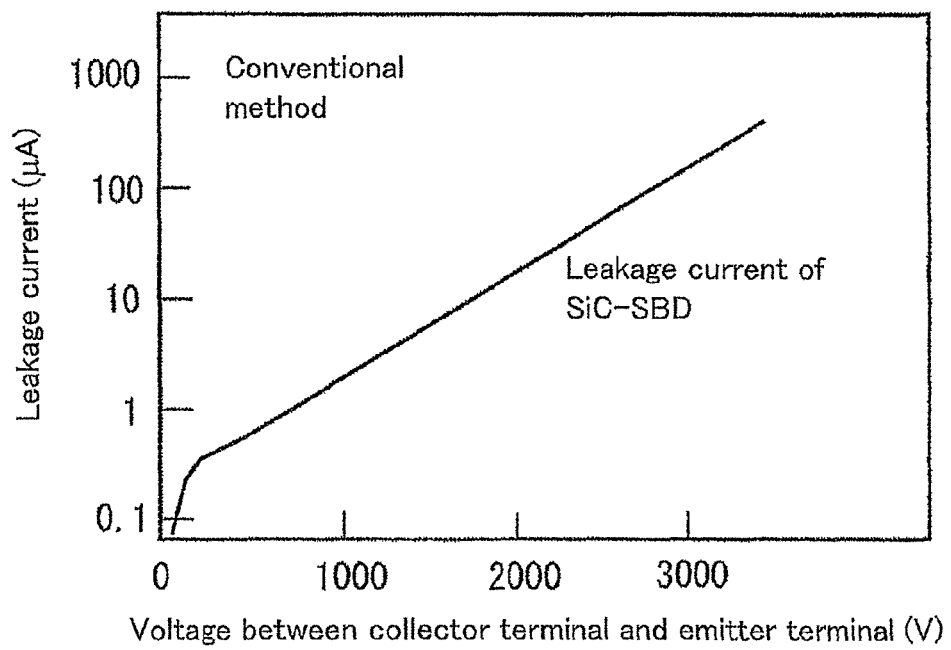
FIG. 5 is a measurement example of a leakage current of a conventional power semiconductor apparatus.

FIG. 4 shows a circuit diagram of the conventional power semiconductor apparatus in FIG. 3. In the conventional power semiconductor apparatus, a collector terminal of the Si-IGBT 11 and a cathode terminal of the SiC-SBD 12 are both connected to the collector terminal 22, and an emitter terminal of the Si-IGBT 11 and an anode terminal of the SiC-SBD 12 are both connected to the emitter terminal 21. In the SiC-SBD 12, a leaking current (leakage current) of the SiC-SBD 12 at OFF-state is about one digit larger than that of the Si-IGBT 11. Therefore, in the conventional power semiconductor apparatus, when a leakage current between, the collector terminal and the emitter terminal is measured, only a leakage current mostly by the SiC-SBD is measured as shown in FIG. 5, thereby resulting in difficulty in measuring a leakage current of the Si-IGBT. Accordingly, it is difficult to conduct an accurate inspection of the leakage current of the Si-IGBT 11 in the inspection process of the module.

Figure 6:
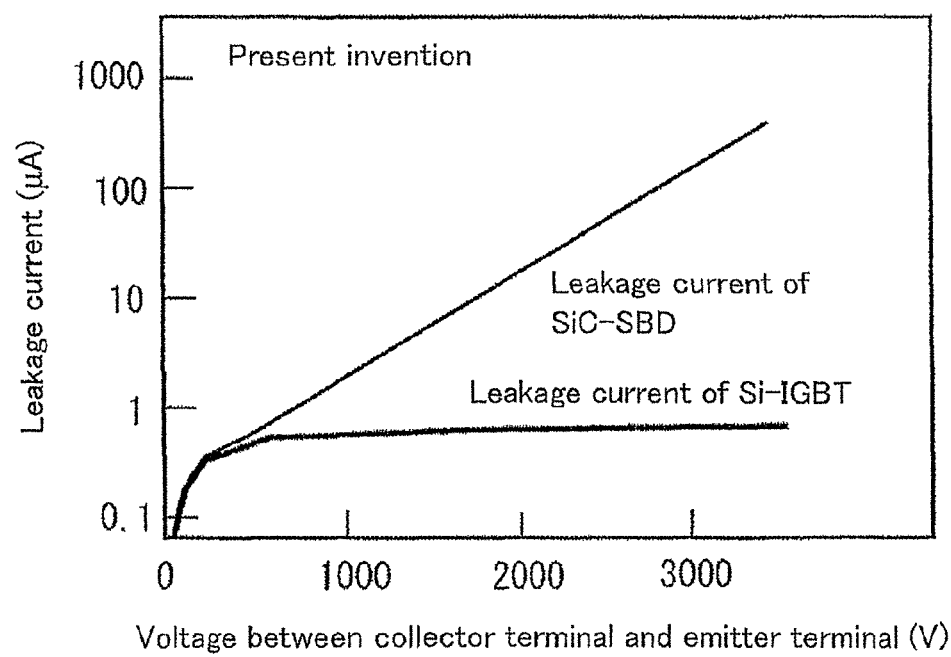
FIG. 6 is a measurement example of a leakage current of the power semiconductor apparatus according to the first embodiment.

In contrast, in the embodiment of the present invention, as shown in FIG. 6, a leakage current of the Si-IGBT can be accurately measured by separating a collector terminal of the Si-IGBT 11 from a cathode terminal of the SiC-SBD 12 and an emitter terminal of the Si-IGBT 11 from an anode terminal of the SiC-SBD 12. In addition, since the positive and negative main terminals of the Si-IGBT 11 are separated from the positive and negative main terminals of the SiC-SBD 12 within the power semiconductor apparatus and they are not connected to each other by an internal conductor, that is, by a thermal conductor, a thermal conduction between the main terminals of the Si-IGBT 11 and the SiC-SBD 12 can be prevented. Therefore, combined with use of individual insulated metal substrates 31, 32 and individual heat dissipation metal bases 38, 39, the SIC-SBD 12 can be operated at a high temperature without limitation of the operation temperature of the Si-IGBT 11.

In the embodiment, a distance between the Si-IGBT 11 and the SiC-SBD 12 increases due to mounting of the Si-IGBT 11 and the SiC-SBD 12 on the individual insulated metal bases, respectively. However, by disposing a different main terminal for each device, the connection between the devices can be made with a low inductance wiring outside the module and a reverse recovery current (recovery current) of the SiC-SBD becomes small. As a result, effect of a wiring inductance between the Si-IGBT 11 and the SiC-SBD 12 can be reduced.

It is noted that if a collector terminal of the Si-IGBT 11 is separated from a cathode terminal of the SiC-SBD 12, it is unnecessary to separate an emitter terminal of the Si-IGBT 11 from an anode terminal of the SiC-SBD 12 for accurately measuring a leakage current of the Si-IGBT 11. In addition, instead of the above, an emitter terminal of the Si-IGBT 11 may be separated from an anode terminal of the SiC-SBD 12 for accurately measuring a leakage current of the Si-IGBT 11.

In the embodiment, a power semiconductor device using Si as a base substance is an IGBT. However, a switching device, for example, a MOS-FET, a MIS-FET and a junction FET may be used. In addition, a power semiconductor device using SiC as a base substance is a Schottky-barrier diode. However, a PiN diode may be used. Furthermore, other than SiC, a wide-gap semiconductor such as GaN may be used.

Figure 7:
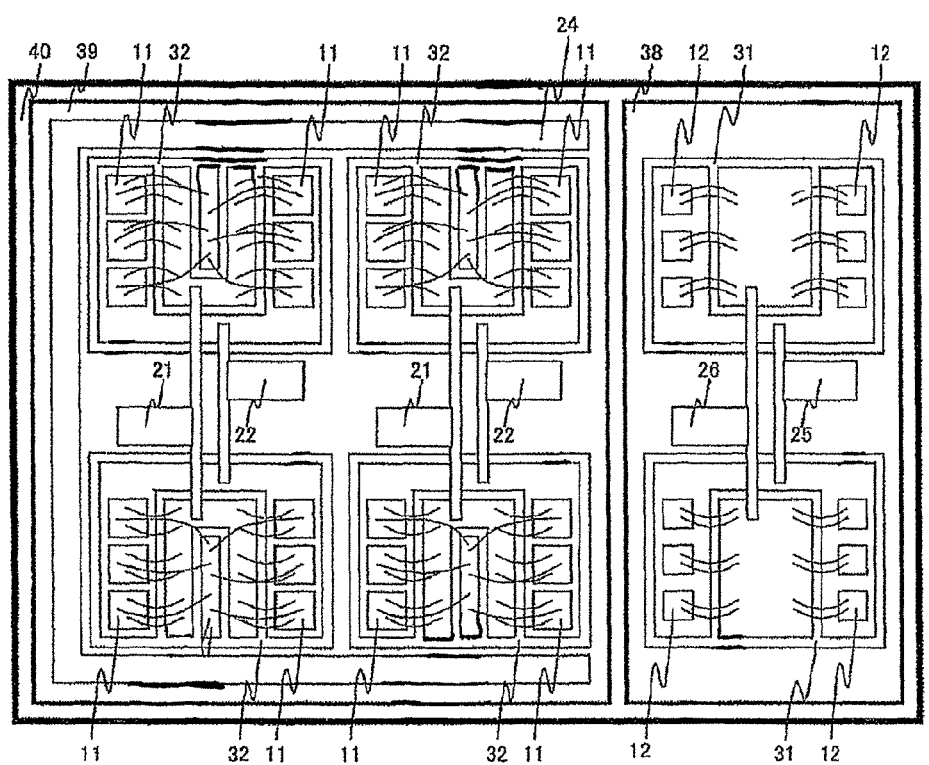
FIG. 7 is a mounting arrangement of a power semiconductor apparatus according to a second embodiment of the present invention.

FIG. 7 shows a mounting arrangement of a power semiconductor apparatus according to a second embodiment of the present invention. The same component and a terminal having the same function with the first embodiment are shown with the same symbol.

Figure 8:
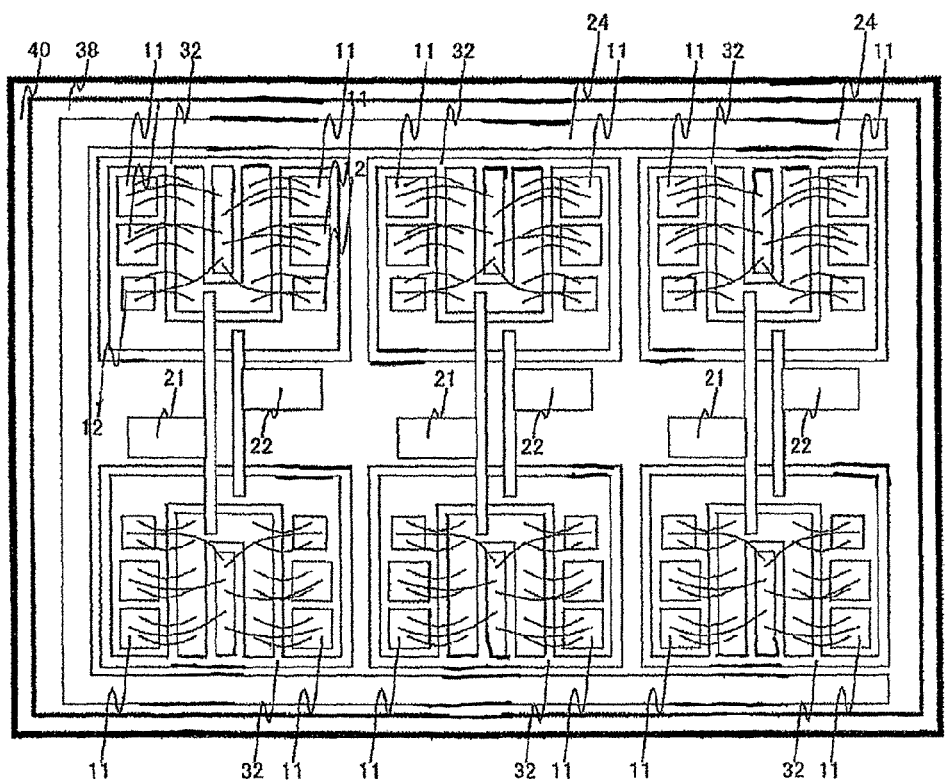
FIG. 8 is a mounting arrangement example of a conventional power semiconductor apparatus.

FIG. 8 shows a mounting arrangement example of a conventional power semiconductor apparatus. In the mounting arrangement example, four Si-IGBT 11 and two SiC-SBD 12 are mounted on a single insulated metal substrate 32 and six insulated metal substrates 32 are mounted on the heat dissipation metal base 38 to form a power semiconductor module. In this case, due to heat generation of the Si-IGBT 11 and the SiC-SBD 12, a heat is likely to be transferred to each chip via the insulated metal substrate 32.

In contrast, in the embodiment of FIG. 7, four insulated metal substrates on each of which six Si-IGBT 11 are mounted are mounted on the heat dissipation metal base 39 as with the first embodiment, and similarly, two insulated metal substrates 31 on each of which six SiC-SBD 12 are mounted are mounted on the heat dissipation metal base 38 to form a power semiconductor module. In the embodiment, as with the first embodiment, the heat dissipation metal base 39 including the insulated metal substrate 32 on which the Si-IGBT 11 is mounted is separated from the heat dissipation metal base 38 including the insulated metal substrate 31 on which the SiC-SBD 12 is mounted. Accordingly, the SiC-SBD 12 can be operated at a temperature higher than the operation temperature of the Si-IGBT 11.

In addition, a collector terminal of the Si-IGBT 11 is separated from a cathode terminal of the SiC-SBD 12 and an emitter terminal of the Si-IGBT 11 is separated from an anode terminal of the SiC-SBD 12. Therefore, as with the first embodiment, it becomes possible to measure a leakage current of the Si-IGBT 11 accurately.

Figure 9:
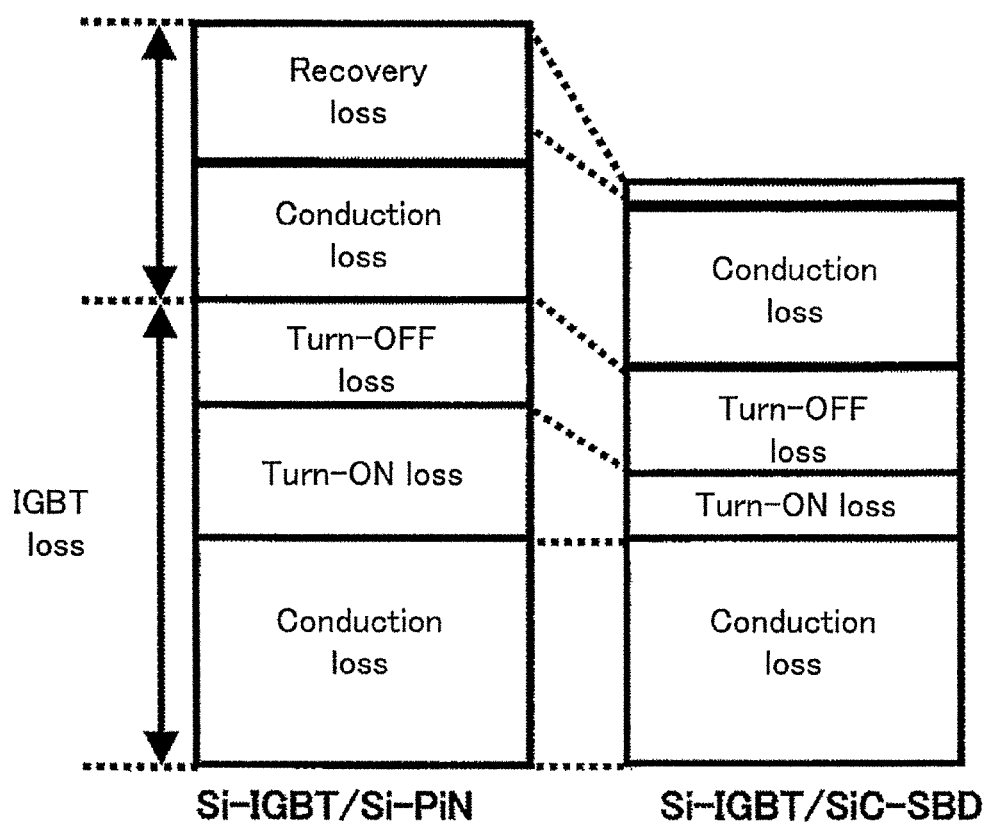
FIG. 9 is a power loss when a power semiconductor apparatus according to the embodiment of the present invention is applied to an inverter.

FIG. 9 shows a power loss reduction effect when a power semiconductor apparatus according to the first or the second embodiment of the present invention is applied to an inverter, which is an electric power conversion system. A calculation example of power loss of a conventional inverter is shown on the left in FIG. 9. An inverter loss is mainly caused in a switching device and a diode. A loss caused by the switching device is expressed by a sum of a conduction loss, a turn-ON loss and a turn-OFF loss, and a loss caused by the diode is expressed by a sum of a conduction loss and a recovery loss. Meanwhile, in the conventional inverter, a Si-IGBT and a PiN diode of Silicon (hereinafter, referred to as Si-PiN diode) are used. The ratio of a conduction loss to a switching loss varies depending on a frequency of the inverter. However, the ratio of an IGBT loss to a diode loss is approximately 2:1 even if the frequency of the inverter is varied. Therefore, if the ratio of an IGBT chip size to a diode chip size is set to 2:1, the ratio of a heat resistance of the chip to a heat resistance of the insulated metal substrate becomes 1:2. As a result, the junction temperatures of the chips can be set substantially the same.

As shown in FIG. 9, according to the embodiment of the present invention, the recovery loss and the turn-ON loss are mainly reduced, and a total loss of the inverter is substantially reduced in comparison with the conventional one.

Figure 10:
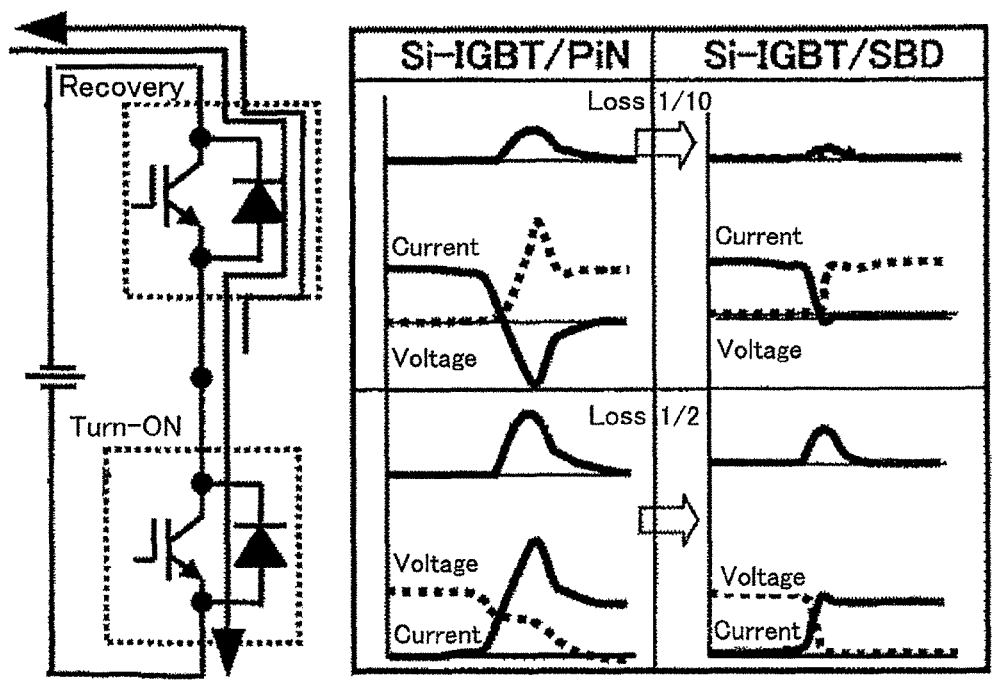
FIG. 10 is voltage and current waveforms when a SiC-SBD is applied to a power semiconductor apparatus.

FIG. 10 is voltage and current waveforms when a SiC-SBD is applied to a power semiconductor apparatus. If a Si-PiN diode is replaced by a SiC-SBD, a recovery loss of the diode becomes substantially 0 (zero), thereby can be reduced to about 1/10 as shown in an upper drawing in FIG. 10, and since the recovery current is not superimposed at the turn-ON, the turn-ON loss can be reduced to about 1/2.

In this case, since the diode loss can be reduced to about 1/2 in comparison with the conventional one, a chip size of the SiC-SBD can be reduced to about 1/4 of that of the Si-IGBT. Therefore, in a power semiconductor apparatus according to the embodiment of the present invention, the ratio of a device area of a power semiconductor device using Si as a base substance to a device area of a power semiconductor device using SiC or GaN as a base substance becomes 0.8 to 1.2 times the ratio, e.g. the quotient, of a device loss of the power semiconductor device using Si as a base substance to (divided by) a device loss of the power semiconductor device using SiC or GaN as a base substance.

In the foregoing embodiment in FIG. 7, a chip size of SiC is reduced to 1/4 as described above. If a SiC-SEM, a SiC-PiN diode, a GaN-SBD, or a GaN-PiN is used, a device area of a power semiconductor device using SiC or GaN as a base substance can be reduced to not more than 1/3 of a device area of a power semiconductor device using Si as a base substance. As a result, a size of the power semiconductor apparatus can be reduced, while ensuring the reliability.

Figure 11:
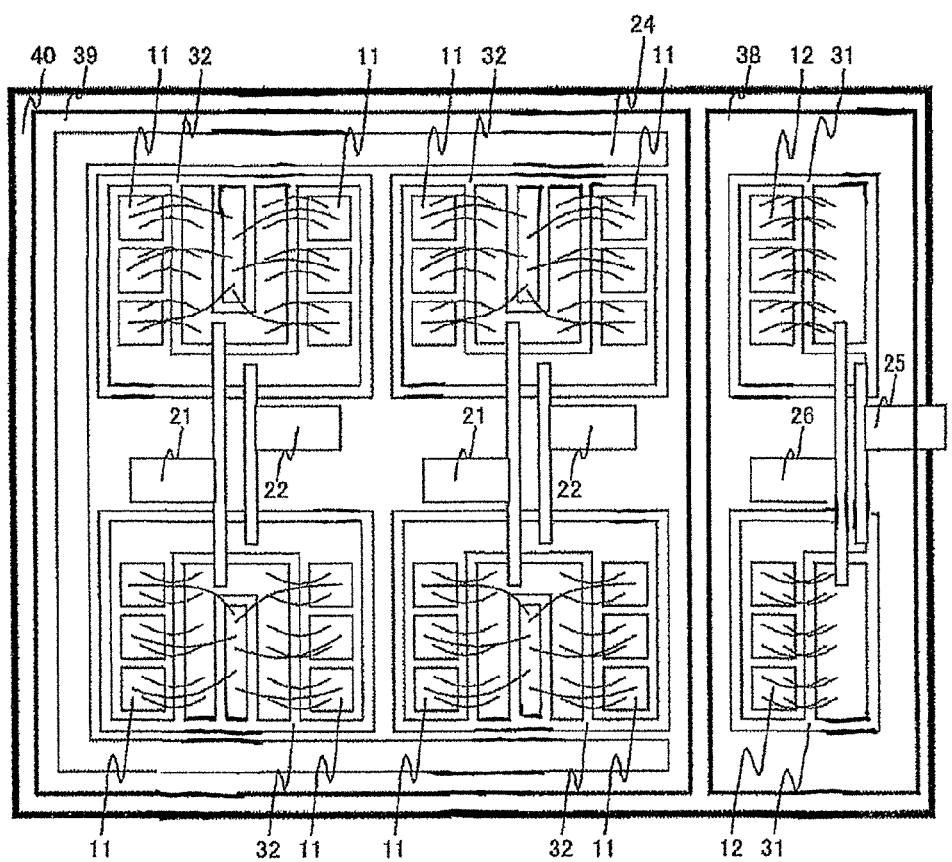
FIG. 11 is a mounting arrangement of a power semiconductor apparatus according to a third embodiment of the present invention.

FIG. 11 shows a mounting arrangement of a power semiconductor apparatus according to a third embodiment of the present invention. A size of the power semiconductor apparatus was reduced by reducing a device area of the IGBT that is a power semiconductor device using Si as a base substance.

The embodiments of the present invention have been described in detail. However, the present invention is not limited to the foregoing embodiments, and it is obvious that various changes may be made without departing from the scope of the technical idea of the present invention.

What is claimed is:

1. A power semiconductor apparatus comprising:
   a first power semiconductor device using Si as a base substance; and
   a second power semiconductor device using a semiconductor as a base substance which has an energy bandgap wider than an energy bandgap of Si; and
   wherein a ratio of a device area of the first power semiconductor device to a device area of the second power semiconductor device is 0.8 to 1.2 times a ratio of a device loss of the first power semiconductor device to a device loss of the second power semiconductor device; and
   wherein the first power semiconductor device is an IGBT and the second power semiconductor device is a Schottky-barrier diode.

* * * * *